United States Patent [19]
Takahashi et al.

[11] Patent Number: 5,905,668
[45] Date of Patent: May 18, 1999

[54] CONTENT ADDRESSABLE MEMORY DEVICE

[75] Inventors: Noriaki Takahashi; Hideaki Odagiri; Koji Takeshita; Yuji Uyama, all of Tokyo, Japan

[73] Assignee: Oki Electric Industry Co., Ltd., Tokyo, Japan

[21] Appl. No.: 08/958,402

[22] Filed: Oct. 29, 1997

[30] Foreign Application Priority Data

Oct. 31, 1996 [JP] Japan ................................ 8-289703

[51] Int. Cl.⁶ ................................................ G11C 15/00
[52] U.S. Cl. ........................................ 365/49; 365/189.01
[58] Field of Search ............................. 365/49, 189.01, 365/230.01

[56] References Cited

U.S. PATENT DOCUMENTS

5,130,945   7/1992   Hamamoto et al. ..................... 365/49

*Primary Examiner*—Terrell W. Fears
*Attorney, Agent, or Firm*—Jones, Volentine, Steinberg & Whitt, L.L.P.

[57] ABSTRACT

A CAM device has an HIT flag cell and a word select separation circuit, with data being stored in a plurality of CAM cells. The HIT flag cell then stores whether or not data stored in the CAM and inputted words (data) coincide. The word select separation circuit the detects the lowest address values corresponding to words within coinciding words and then sequentially resets HIT flag cells storing the coinciding of words.

9 Claims, 6 Drawing Sheets

CONTENT ADDRESSABLE MEMORY DEVICE

CROSS REFERENCE TO RELATED APPLICATION

This application claims priority of Japanese application Serial No. 289703/1996 filed Oct. 31st, 1996, the subject matter of which is incorporated herein by reference.

BACKGROUND OF THE INVENTION

The present invention relates to a Content Addressable Memory (hereinafter referred to simply as "CAM") Device used in information processing devices and communications devices etc.

CAM compares an inputted data string and a stored data string and determines whether or not a coincident (HIT) or analogous data string exists within memory. An address of memory storing a coincident or analogous data string can then be outputted by this CAM.

Figure 2:
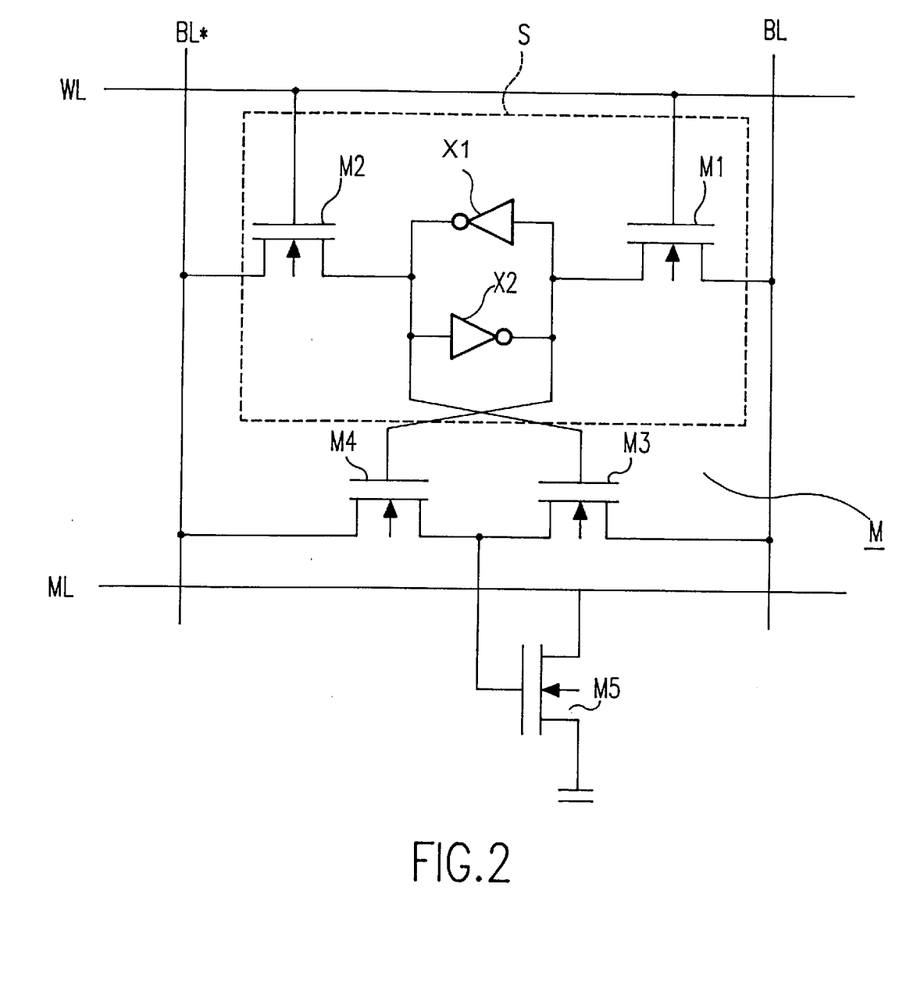
FIG. 2 is a circuit diagram showing a configuration of a typical related CAM cell.

In order to bring about these functions, individual CAM cells M used in CAM have the configuration of a usual SRAM cell with the addition of a comparing transistor, as in the example configuration shown in FIG. 2.

A CMOS type SRAM cell S is comprised of inverters X1 and X2 with inputs and outputs connected and NMOS transistors M1 and M2. Comparing of information stored within this SRAM and data inputted via a pair of bit lines BL and BL* (which is the signal for BL inverted) is carried out by NMOS transistors M3, M4 and M5.

In the following, a description is given of the basic operation of a CAM cell M using FIG. 2 (hereafter, the character "H" indicates a high level signal and the character "L" indicates a low level signal). The operation of writing data to a CAM cell M is basically the same as the operation for writing to a usual CMOS type SRAM comprising six transistors. When the NMOS transistors M1 and M2 are put on by the word line WL and BL="H" and BL*="L" are inputted to the bit line pair BL and BL*, the right side of the SRAM cell S is set to "H" and the right side is set to "L". These values are also held for the case when bit line pair BL and BL* are both set to "L" and the NMOS transistors M1 and M2 are both turned off. This state is defined as storage data "1". When BL="L" and BL*="H" are inputted, the inverse of this data is saved, with this inverse state being defined as storage data "0".

Next, a description is given of a search/compare operation. All of the word lines WL are set to an "L" level, the match lines ML are set to "H" and data is inputted to the search target bit line pair BL and BL*. The search target outer bit line pair BL and BL* are both held at "L" for masking purposes.

When storage data within the SRAM and data inputted at the bit line pair do not coincide using these searched bits, for example, when the storage data is "1", the right side of the SRAM cell S is "H". The gate of the NMOS transistor M4 therefore becomes "H" and the NMOS transistor M4 turns on.

At this time, as the data that does not coincide is "0", the data inputted to the bit line pair BL and BL* is BL="L" and BL*="H". The potential "H" of the bit line BL* is supplied to the gate of the NMOS transistor M5 via the NMOS transistor M4, the NMOS transistor M5 turns on and the potential of the match line ML is pulled down via the NMOS transistor M5.

On the other hand, if the storage data is "0", the non-coinciding data is "1". At this time, the data inputted to the bit line pair BL and BL* is BL="H" and BL*="L" so that the left side of SRAM cell S is "H". The gate of NMOS transistor M3 therefore becomes "H" and the NMOS transistor M3 is put on. The potential "H" of the bit line BL is then supplied to the gate of NMOS transistor M5 via NMOS transistor M3, NMOS transistor M5 goes on and the potential of the match line ML is pulled down via the NMOS transistor M5.

With respect to this, when the storage data within the SRAM cell S and the data inputted to the bit line pair coincide, at the NMOS transistors M3 and M4, the source potential of the NMOS transistor of the side to which "H" is supplied to the gate usually becomes "L" and this NMOS transistor cannot be put on. The NMOS transistor M5 therefore stays off and the potential of the match line ML is held at "H" without the potential of the match line ML being pulled down.

However, as the bit line pair BL and BL* are both "L" for non-search bits, the source side will always become "L" even when "H" is supplied to either of the gates of NMOS transistor M3 and NMOS transistor M4 and the NMOS transistor M5 therefore does not go on. This means that the potential of the match line ML is not pulled down.

As the match line ML is similarly connected to the CAM cells M of all of the bits for the same word, the match line is kept at "H" only when all of the bits not masked with respect to the storage data string and the inputted data string coincide.

Generally, CAM is equipped with a register for storing search result processing circuitry and select signals and a word select separation circuit etc. for selecting one from a plurality of selected words and is capable of outputting a plurality of words for which coincidence has been detected. When coincidence is detected for data within this plurality of words, there is an urgent need for a function for sequentially outputting this word information in the case where CAM is applied to the information processing field.

However, the plurality of select dividing circuits necessary to sequentially output a plurality of word information have to input match lines from all words and when these circuits are configured from basic logic circuitry, the logic depth increases dramatically when compared with the word lines. Operating speed therefore deteriorates and circuit surface area therefore increases.

A CAM is therefore desired where a plurality of word information can be sequentially outputted with circuitry that is small in scale.

Further, a CAM capable of high speed operations even for configurations where there are a large number of words is also desirable.

SUMMARY OF THE INVENTION

It is a primary object of the present invention to provide a CAM capable of sequentially outputting a plurality of word information with a circuit that is small in scale and capable of operating at high speeds while being configured with a large number of words.

It is a further object of the present invention to provide a CAM with a large number of words that is capable of operating at high speeds using a dynamic circuit performing an operation of selecting one word from a plurality of coinciding words and an operation of detecting presence or absence of word information to be outputted.

It is still another object of the present invention to provide a CAM with a control circuit configured using few elements that can be laid out in a simple manner together with the CAM cells.

These and other objects are accomplished by providing the content addressable memory of the present invention with a content addressable memory cell group being equipped with a plurality of memory cells addressed by a plurality of bit line pairs and a plurality of word lines arranged in a matrix, determining coincidence of data stored in the memory cells and data supplied at the bit line pairs, and outputting coincidence determination signals to a plurality of match lines provided so as to correspond to the plurality of word lines. The content addressable memory of the present invention is also provided with a plurality of storage groups, connected respectively to the plurality of match lines and being capable of having storage contents reset by an inputted reset signal, for storing the coincidence determination signals.

Further, in order to realize the above objects the CAM of the present invention sequentially scans coincidence determination results for CAM cell groups stored at the storage circuits and addresses at which coinciding data is stored are detected by sequentially selecting storage circuits storing coincidence determination signals exhibiting coincidence from the storage circuits.

Moreover, in order for the CAM of the present invention to carry out sequential scanning, there is provided select means connected to the plurality of storage circuits, for sequentially selecting storage circuits storing coincidence determination signals exhibiting coincidence and supplying the reset signals only to already selected storage circuits.

Still further, with the CAM of the present invention, whichever of the storage circuits are provided with controllers for controlling outputting to the select means in accordance with the presence or absence of at least one storage circuit, of said plurality of storage circuits, storing a coincidence determination signal exhibiting coincidence.

DETAILED DESCRIPTION OF THE PREFERRED EMBODIMENTS

First Embodiment

Figure 1:
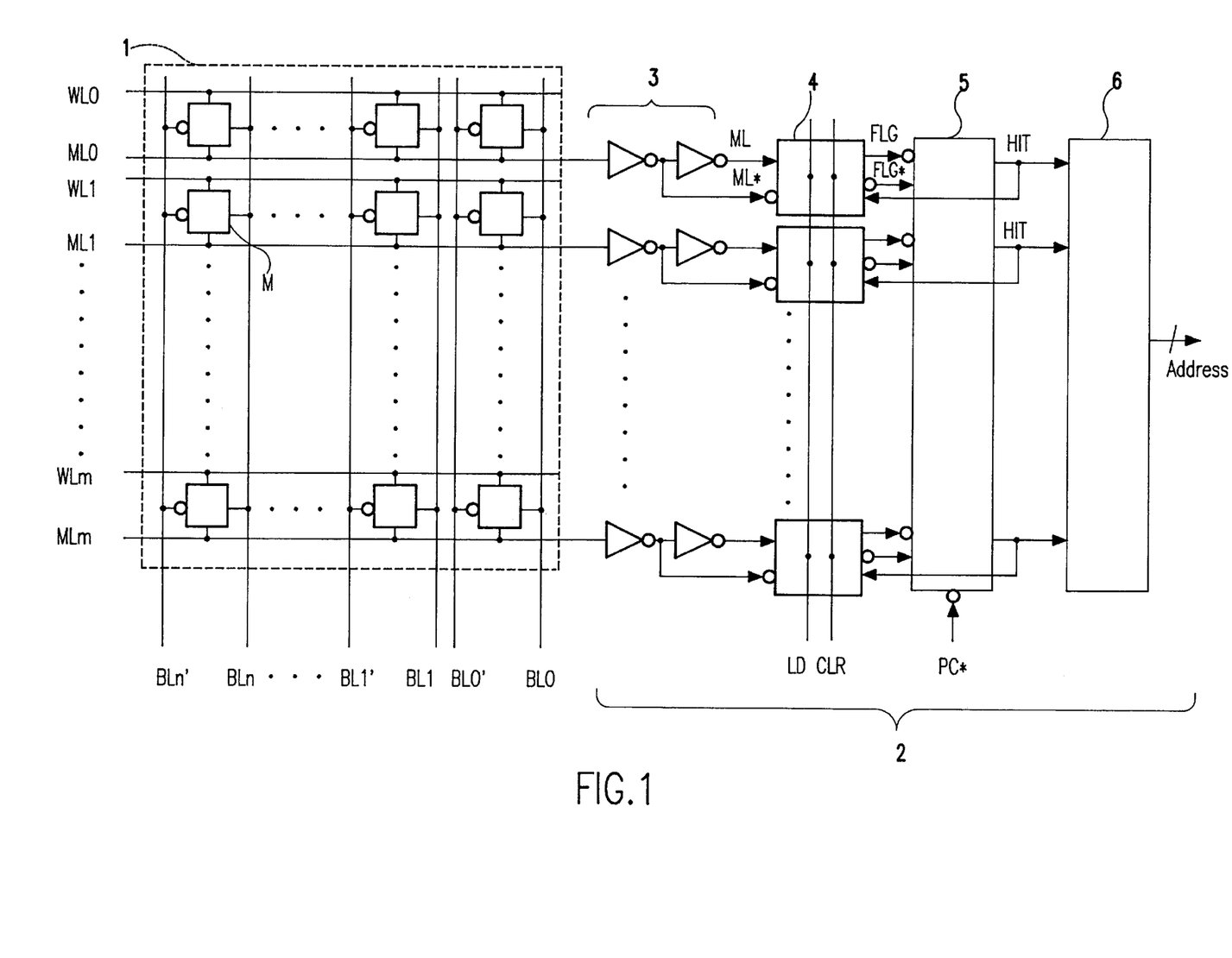
FIG. 1 is a block diagram showing a configuration of a CAM of a first embodiment of the present invention.

The following is a description with reference to the drawings of a first embodiment of a CAM of the present invention. FIG. 1 is a block diagram showing the overall configuration of the CAM of the first embodiment.

The CAM is equipped with a CAM cell block 1 equipped with a plurality of CAM cells M and a detect circuit block 2. The CAM cell block 1 comprises an (m+1) word X (n+1) bit memory. Namely, the CAM cells M shown in FIG. 2 are arranged in an (m+1) X (n+1) matrix and a configuration is adopted where each of the CAM cells M can be selected by (m+1) word lines WL and match lines ML and (n+1) pairs of bit line pairs (BL, BL*).

The detect circuit block 2 comprises an inverter circuit stage 3 for generating complementary signals for signals from each of the match lines ML of the CAM cell block 1, a hit flag cell 4 for temporarily holding signals supplied from each of the matching lines ML of the CAM cell block 1, a word select separation circuit 5 and an encoder circuit 6.

Although this has been omitted from FIG. 1, in reality, means are required for charging up match lines ML for each word.

The hit flag cell 4 has the configuration shown in FIG. 3 and is described in the following using FIG. 3. Data supplied from a match line ML is stored at CMOS type SRAM cells comprising two inverters X3 and X4 having inputs and outputs connected and two NMOS transistors M6 and M7. The inverter circuit stage 3 then inputs a signal of a match line ML to the NMOS transistor M6 and inputs a signal (ML*) that is an inversion of a signal for a match line ML to the NMOS transistor M7. When the write signal LD becomes "H", the NMOS transistors M6 and M7 go on. At this time, the potential outputted to match lines ML for each word are written to the SRAM cell of inverters X3 and X4. The hit flag cell 4 is equipped with an FLG terminal and an FLG* terminal, for outputting complementary outputs for storage data, as output terminals. Resets from the hit flag cell 4 are controlled by NMOS transistors M8 and M9 connected to inverters X3 and X4. When a HIT signal supplied to the gate terminal of NMOS transistor M8 and a CLR signal supplied to the gate terminal of NMOS transistor M9 are both "H", the SRAM cell of inverters X3 and X4 are short circuited, the potential is pulled down from the SRAM of inverters X3 and X4 and the storage data is cleared (put to value 0).

It is not necessary to provide NMOS transistors M9 and CLR terminals at all of the hit flag cells 4. Alternatively, for example, the drains of the NMOS transistors M8 for all of the hit flag cells 4 can be connected in common and just one NMOS transistor switch can be provided across this line and ground, with the gate terminal of this transistor then being taken as a clear terminal.

As shown in FIG. 1, flag terminals FLG and FLG* present at the output terminals of the hit flag cells 4 provided every word are connected to the word select separation circuits 5. The word select separation circuit 5 then selects one word from words for which the FLG signal is "1" and the FLG* signal is "0" and "H" is outputted from the HIT terminal corresponding to the selected word.

Each HIT terminal of the word select separation circuit 5 is connected to a corresponding gate terminal of an NMOS transistor M8 of a hit flag cell 4. When a signal "H" is then supplied from a HIT terminal, the NMOS transistor M8 goes on.

Figure 4:
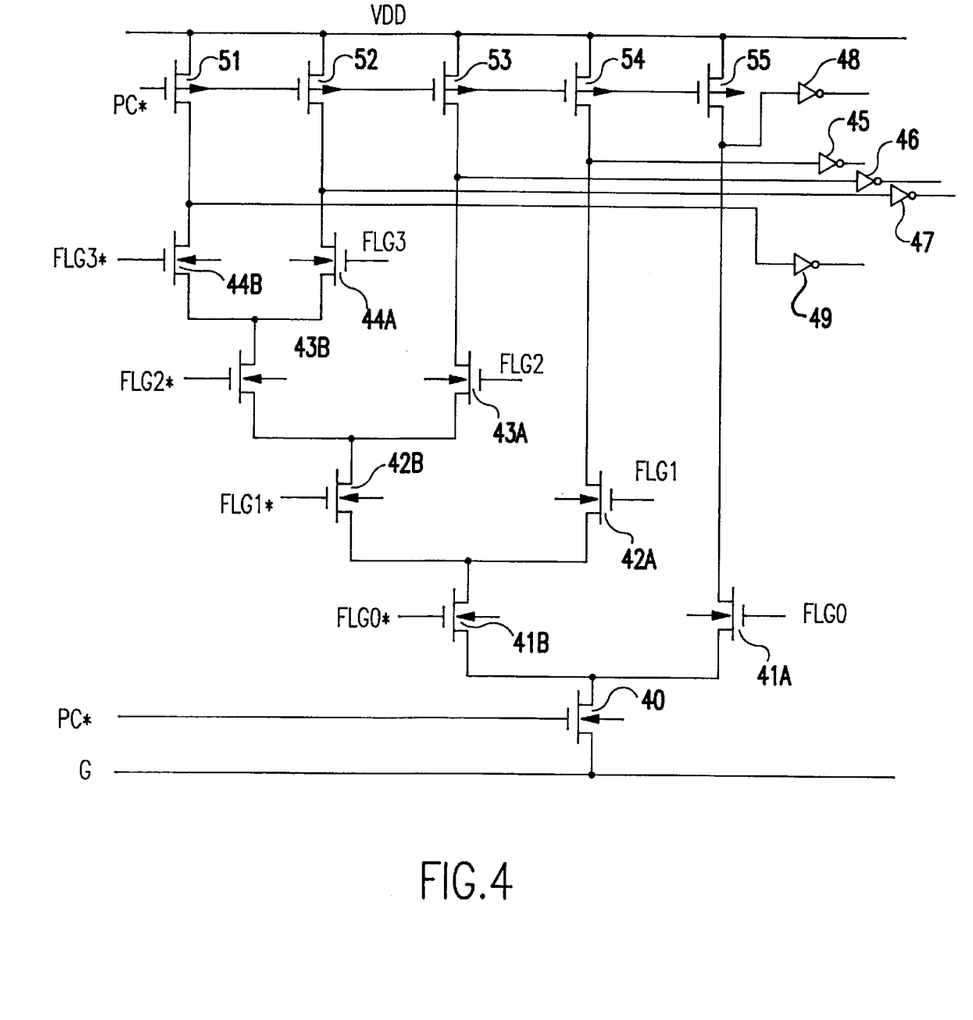
FIG. 4 is a circuit diagram showing the configuration of a word select separation circuit of the first embodiment of the present invention.

FIG. 4 is a basic structural view of the word select separation circuit 5 and just a four word portion is shown to simplify the description.

The word select separation circuit 5 is equipped with four NMOS transistor pairs (41A, 41B), (42, 42B), (43A, 43B), (44A, 44B) corresponding to word 0, word 1, word 2 and word 3, respectively. An NMOS transistor 40 functioning as a gate linking the NMOS transistor pair (41A, 41B) and the ground line G and five PMOS transistors 51, 52, 53, 54 and 55 functioning as gates connected across NMOS transistors 44B, 44A, 43A, 42A and 41A and a power supply, respectively, are also provided at the word select separation circuit 5, together with five inverters 45, 46, 47, 48 and 49 for outputting HIT signals.

An inverted signal PC* for a pre-charge signal is inputted to the gate of the NMOS transistor 40. The drain of NMOS transistor 40 is connected to the sources of the NMOS transistor pair of 41A and 41B and the source of NMOS transistor 40 is connected to a ground line G. The drain of NMOS transistor 41A is connected to inverter 48, as well as being connected to a power supply VDD via PMOS transistor 55. The drain of NMOS transistor 41B is connected to the sources of the NMOS transistor pair of 42A and 42B. The drain of NMOS transistor 42A is connected to inverter 45 and also connected to the power supply VDD via a PMOS transistor 54. The drain of NMOS transistor 42B is connected to the sources of the NMOS transistor pair 43A and 43B. The drain of NMOS transistor 43A is connected to inverter 46 and connected to the power supply VDD via a PMOS transistor 53. The drain of NMOS transistor 43B is connected to the sources of the NMOS transistor pair of 44A and 44B. The drain of NMOS transistor 44A is connected to inverter 47 and connected to the power supply VDD via PMOS transistor 52. The drain of NMOS transistor 44B is connected to inverter 49, and connected to the power supply VDD via PMOS transistor 51. The outputs of inverters 45 to 48 are inputted to the hit flag cells 4 and encoders 6 of words corresponding to the HIT output.

An FLG signal and an FLG* signal (inversion of FLG signal) are supplied from the hit flag cells 4 for corresponding words to each of the gate terminals of the NMOS transistor pairs.

When "L" is inputted as an inversion signal PC* for the pre-charge signal, the PMOS transistors 51, 52, 53, 54 and 55 go on and the NMOS transistor 40 goes off. Each node connected to the input terminals of inverters 45, 46, 47, 48 and 49 are then charged up to "H".

When the inverted signal PC* for the pre-charge signal is taken to be "H", just output terminals corresponding to a word of the smallest address value of the words for which FLG signal is "1" and FLG* signal is "0" output "H". For example, when word 0 and word 3 are both "1" and word 1 and word 2 are both "0", the NMOS transistor 40 is put on by the PC* signal and the NMOS transistor 41A is put on by the FLG0 signal of "1". The potential of the input terminal of the inverter 48 corresponding to the word 0 is therefore pulled down and the inverter 48 therefore outputs "H". With regard to word 3, the NMOS transistor 44A is put on by an FLG3 signal of "1" and NMOS transistors 43B and 42B of the transistors connected to the drain side of the NMOS transistor 44A are put on by an FLG2* signal of "1" and an FLG0* signal of "1" but the NMOS transistor 41B remains off due to the an FLG0* signal of "0". The inverter 47 therefore outputs "L" without the potential of the input terminal of inverter 47 corresponding to word 3 being pulled down. Further, when the FLG signal is "1" and the FLG* signal is "0" for all of words 0 to 3, the inverter 49 outputs "H" as a carry of zero.

In the circuit of FIG. 4, as the number of elements required per one word is completed by one NMOS transistor pair, one PMOS transistor for pre-charging and one inverter, a dynamic circuit structure can be adopted and high speed operation is possible. This can also be applied to larger word configurations.

Next, the operation of a CAM of the first embodiment having the overall configuration shown in FIG. 1 will be described.

First, a description is given of the case where data is inputted to the bit line pair BL and BL* and a search is carried out after match lines ML are charged to "H" by a charge up circuit not shown in the drawings.

The CAM cells M can have the same configuration as the CAM cells M shown in FIG. 2 described in the related example. In this search, all of the word lines WL are first set to an "L" level, the match lines ML are set to "H" and data is inputted to the bit line pair BL and BL* of the search object. The outer bit line pair for the search object are both held at "L" for masking purposes.

As shown in FIG. 2, when the storage data within an SRAM cell S and data inputted to the bit line pair does not coincide using the search bits, for example, at the time when the storage data is "1", the right side of the SRAM cell S is "H". The gate of the NMOS transistor M4 therefore becomes "H" and the NMOS transistor M4 goes on. At this time, as the non-coinciding data is "0", the data inputted to the bit line pair BL and BL* is BL="L" and BL*="H", the potential "H" of the bit line BL* is supplied to the gate of the NMOS transistor M5 via the NMOS transistor M4 and the NMOS transistor M5 goes on. The potential of the match line ML is therefore pulled down via the NMOS transistor M5.

On the other hand, if the storage data is "0", the non-coinciding data is "1". The data inputted to the bit line pair BL and BL* therefore becomes BL="H" and BL*="L" and the left side of the SRAM cell S becomes "H". The gate of the NMOS transistor M3 therefore becomes "H" and the NMOS transistor M3 goes on. The potential "H" off the bit line BL is then supplied to the gate of the NMOS transistor M5 via the NMOS transistor M3, the NMOS transistor M5 goes on, and the potential of the match line ML is pulled down via the NMOS transistor M5.

With regards to this, when storage data within an SRAM cell S and data inputted at the bit line pair coincide, the source potential of the NMOS transistor of the side supplying a "H" to the gates of the NMOS transistors M3 and M4 always becomes "L" and this NMOS transistor cannot be put on. The NMOS transistor M5 therefore remains off and the potential of the match line ML is kept at "H" without the potential of the match line ML being pulled down.

On the other hand, with regards to the non-search bits, as the bit line pair BL and BL* are both "L", the source side is always "L" even when "H" is supplied to the gate of either of the NMOS transistor M3 and the NMOS transistor M4 and the NMOS transistor M5 therefore cannot be put on. The potential of the match line ML therefore cannot be pulled down. As the match lines ML are similarly connected to the CAM cells M for all of the bits for the same word, the match line ML is held at "H" only when all of the bits for the stored data string and the inputted data string that are not masked coincide.

Figure 3:
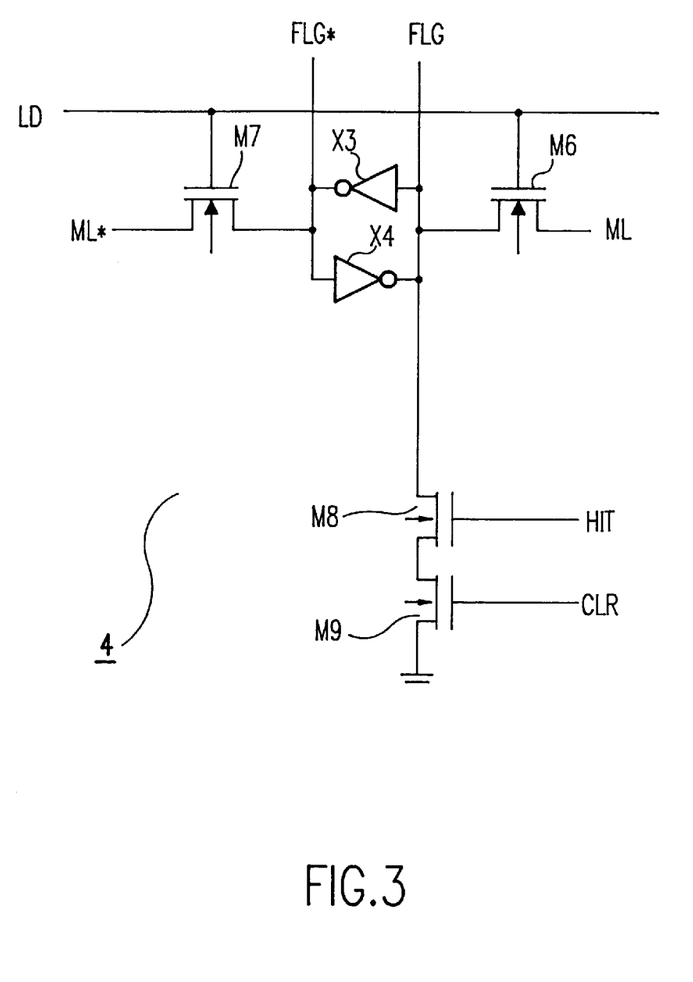
FIG. 3 is a circuit diagram showing a configuration of a hit flag cell of a first embodiment of the present invention.

Next, "H" is inputted to the LD terminal of the hit flag cell 4 shown in FIG. 3. In doing so, "1" is written to the hit flag cell 4 of the word at which the data string coinciding with the search data is stored and "0" is written to the hit flag cell 4 of the word at which the data that does not coincide is stored. At the same time, "L" is inputted to the PC* terminal of the word select separation circuit 5. At this time, the output of the HIT terminals corresponding to each word becomes "H" and the storage content of the hit flag cell 4 corresponding to this word is reset. When "H" is then inputted to the pre-charge terminal PC* of the word select separation circuit 5, just the HIT output corresponding to the word of the smallest address value of the words for which the FLG signal is "1" and the FLG* signal is "0" output a "H", as is described using FIG. 4, with HIT outputs corresponding to the remaining words being "L" so that addresses having coinciding data can be determined. These outputs are then encoded by the encoder circuit 6 as necessary and outputted as a binary address value.

Next, "H" is inputted to the clear terminal CLR of the hit flag cell 4. In doing so, the HIT outputs of the word select separation circuit 5 for words for which addresses have been detected that are already selected are "H". The NMOS transistor M8 shown in FIG. 3 of the corresponding hit flag cell 4 therefore goes on, the NMOS transistor M9 is put on by an "H" inputted to the clear terminal CLR and the hit flag cell 4 is reset. The word select separation circuit 5 then searches for the word of the next smallest address value of the words for which the FLG signal is "1" and the FLG* signal is "0". Describing with reference to FIG. 4, detecting is carried out for word 0, i.e. the hit flag cells 4 for word 0 are reset by the HIT output outputted by the inverter 48, the FLG0 signal is changed from "1" to "0". The word of the smallest address, i.e. word 3, is then detected from words for which the FLG signal is "1" and the FLG* signal is "0". Basically, as the FLG0* signal is changed from "0" to "1" and the NMOS transistor 41B is on, the NMOS transistors 41B, 42B, 43B and 44A are on, the HIT output of the inverter 47 changes to "H" and word 3 is detected.

In addition to the circuit of FIG. 1, a circuit taking the output of a hit flag cell 4 or the output of a word select separation circuit 5 as input that is capable of detecting whether all of the words are "0" (i.e. detecting that there is no information for the words to be outputted) can also be provided. When all of the words are "0", detection is halted. Information for words storing data strings coinciding with searched data can then be sequentially outputted by repeating the above operation only during detection of word information to be outputted by this circuit.

A description is given for four words in the example in FIG. 4. However, in the case of a larger number of words, words coinciding with search data can be detected sequentially in the order of smaller addresses first by repeating the above operation while words coinciding with search data exist. A circuit taking the output of a hit flag cell 4 or the output of a word select separation circuit 5 as input that can detect when all of the words are "0" can also be easily constructed from dynamic NOR circuits, etc.

According to the first embodiment, an operation of selecting one word from a plurality of coinciding words and an operation of detecting the presence or absence of word information to be outputted can be achieved by using a dynamic circuit. CAM having a large number of words can therefore be capable of operating at high speeds.

A portion of the hit flag cell 4 has a circuit configuration (SRAM cell etc.) that is common to the CAM cells M, and as the number of elements comprising this hit flag cell 4 is small, a layout where the hit flag cells are formed together with the CAM cells M can be easily adopted.

The word select separation circuit 5 can be constructed from a small number of elements, i.e. just a pair of NMOS transistors, one PMOS for pre-charging use and one inverter per one word and can therefore be realized with little circuit surface area.

With the CAM of the present invention, in order to carry out sequential scanning, select means is provided in such a manner as to be connected to a plurality of storage circuits and storage circuits storing coincided determination signals exhibiting coincidence are then sequentially selected. Reset signals are then supplied just to storage circuits that have already undergone selection. Sequential scanning can then be automatically carried out by sequentially resetting the storage circuits using this select means and a special address providing circuit therefore does not have to be provided.

Second Embodiment

Next, a description is given with reference to the drawings of a second embodiment of a CAM of the present invention.

Figure 5:
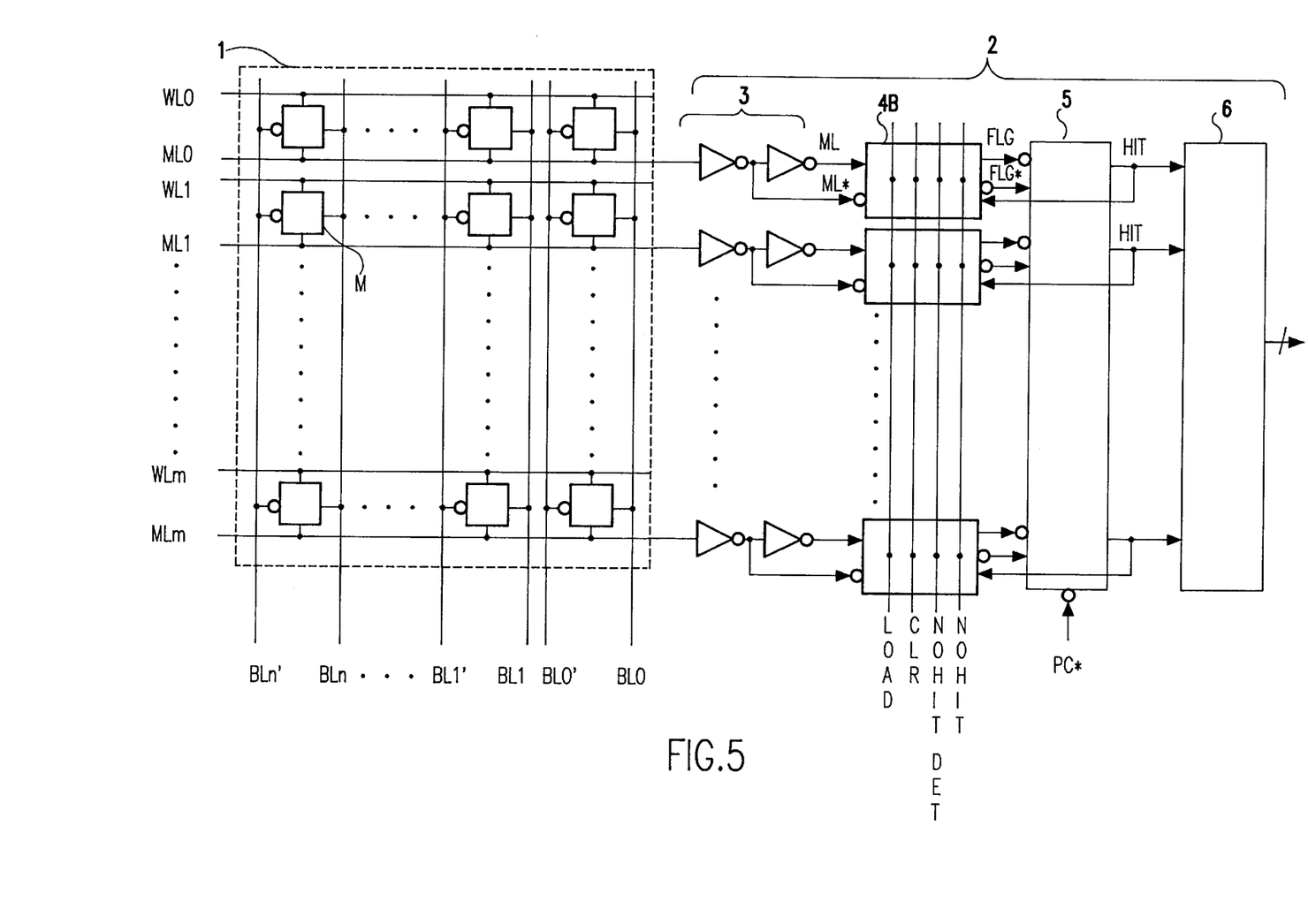
FIG. 5 is a block diagram showing a configuration of a CAM of a second embodiment of the present invention.

FIG. 5 is a block diagram showing an overall configuration of the CAM of the second embodiment, with portions corresponding to portions of FIG. 1 being given corresponding numerals.

As with the CAM of the first embodiment, the CAM of the second embodiment comprises the CAM cell block 1 equipped with a plurality of CAM cells M arranged in a matrix and the detect circuit block 2.

The CAM cell block 1 is the same as that of the first embodiment. The detect circuit block 2 comprises the inverter circuit stage 3 for generating complementary signals for signals from each of the match lines ML of the CAM cell block 1, a hit flag cell 4B for temporarily holding signals supplied from each of the matching lines ML of the CAM cell block 1, the word select separation circuit 5 and the encoder circuit 6. Therefore only the hit flag cells 4B in the second embodiment are different from those of the first embodiment and other aspects of the second embodiment are the same as the first embodiment. A description will therefore be given in the following only of the hit flag cell 4B and other aspects can be understood from the description of the first embodiment.

A NOHIT signal line and a NOHIT DET signal line for controlling charge up to the NOHIT line are connected to the hit flag cell 4B. Although omitted from FIG. 6, in reality, means for charging up match lines ML and NOHIT lines for each word are also required.

Figure 6:
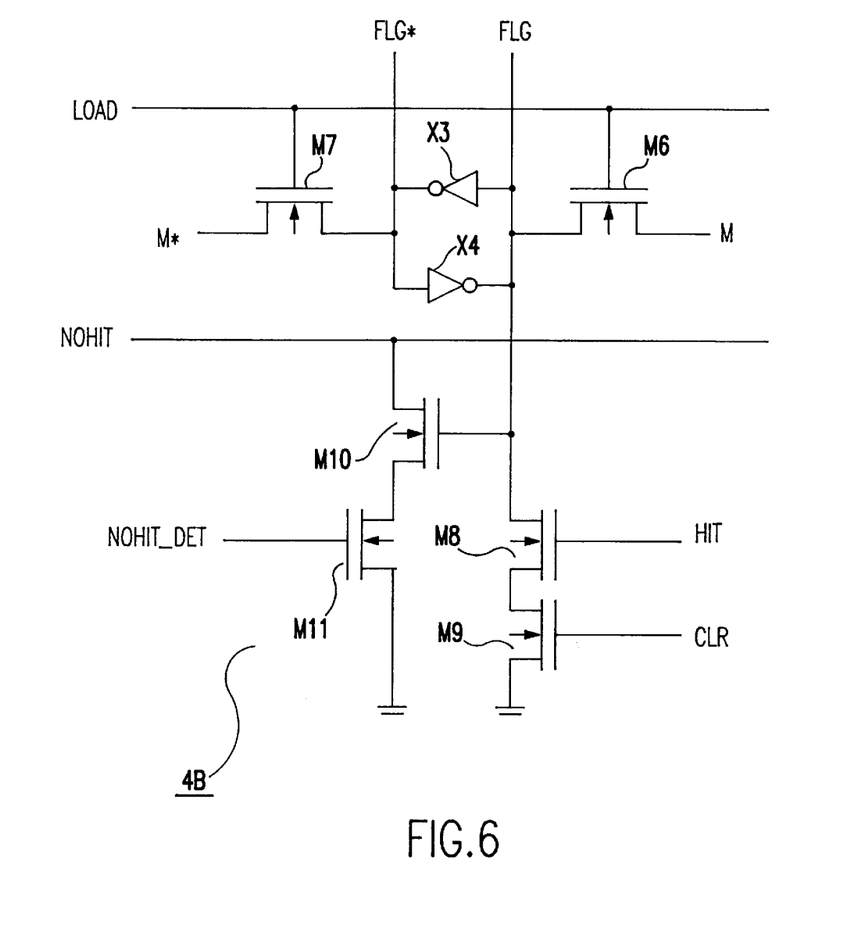
FIG. 6 is a circuit diagram showing the configuration of a hit flag cell of the second embodiment of the present invention.

A specific configuration of the hit flag cell 4B is shown in FIG. 6. Here, two NMOS transistors M10 and M11 are connected to an SRAM cell that is the equivalent to the hit flag cell 4.

The gate of the NMOS transistor M10 is connected in such a manner as to take a signal (FLG) of the positive phase side of the SRAM cell as input. The NOHIT signal line is connected to the source of the NMOS transistor M10 and the source of the NMOS transistor M11 is connected to the drain of NMOS transistor M10. The NOHIT DET signal line is connected to the gate of NMOS transistor M11. It is not necessary to provide this NMOS transistor M11 and NOHIT DET signal line at all of the hit flag cells 4B. It is also possible for the drains of the NMOS transistors M10 for all of the hit flag cells 4B to be connected in common and for the NOHIT DET signal line to be connected to the gate terminal of an NMOS transistor M11 that is just a single switching transistor connected across this common line and ground.

The operation of writing searches and search results to the hit flag cell 4B is the same as for the circuit of the first embodiment, as is the operation of the word select separation circuit 5.

With this CAM, at the same time as writing a value for the match line ML to the hit flag cell 4B or after writing a value for the match line ML to the hit flag cell 4B, an "L" is supplied to the NOHIT DET signal line and the NOHIT signal line is charged up. An "H" is then supplied to the NOHIT DET signal line and charging up is then stopped. At this time, if there is a "1" written to just one of the bit flag cells 4B for all of the words, the potential of the NOHIT signal line is pulled down to "L". The operation of the word select separation circuit 5 that is the same as the circuit for the first embodiment is therefore then carried out only in a period where the potential of the NOHIT signal line is "L".

In the first embodiment, the output of the hit flag cell or the output of the select circuit is taken as input and a circuit is then required to detect when all of the words are "0". However, with the circuit of this second embodiment, the absence of word information to be outputted can be detected using a simple circuit where just two NMOS transistors are added to the hit flag cell 4B. When the potential of the NOHIT signal line is "H", all of the words of the hit flag cell 43B are "0" and there is therefore no word information to be outputted. It is therefore no longer necessary for the word select separation circuit 5 to operate thereafter. The circuit required for this detection can therefore be realized using a smaller circuit surface area as this circuit involves merely adding the two NMOS transistors M10 and M11 to the hit flag cell 4.

Further Embodiments

In the above embodiments configurations involving mainly NMOS transistors are shown but it is also possible to configure a CAM using mainly PMOS transistors or to configure Content Addressable Memories using other transistor elements (bipolar transistors rather than just unipolar transistors, etc.).

While particular embodiments of the present invention have been described and illustrated, it should be understood that the invention is not limited thereto since modifications may be made by persons skilled in the art. The present application contemplates any and all modifications that fall within the spirit and scope of the underlying invention described and claimed herein.

What is claimed is:

1. A content addressable memory comprising:

a content addressable memory cell group being equipped with a plurality of memory cells addressed by a plurality of bit line pairs and a plurality of word lines arranged in a matrix, determining coincidence of data stored in said memory cells and data supplied at said bit line pairs, and outputting coincidence determination signals to a plurality of match lines provided so as to correspond to said plurality of word lines; and a plurality of storage groups, connected respectively to said plurality of match lines and having storage contents reset by an inputted reset signal, for storing said coincidence determination signals.

2. The content addressable memory of claim 1, further comprising select means connected to said plurality of storage circuits, for sequentially selecting storage circuits storing coincidence determination signals exhibiting coincidence and supplying said reset signals to already selected storage circuits.

3. The content addressable memory of claim 1, wherein said plurality of storage circuits have control parts for controlling output to said select means in accordance with the presence or absence of at least one storage circuit, of said plurality of storage circuits, storing a coincidence determination signal exhibiting coincidence.

4. The content addressable memory of claim 2, wherein said plurality of storage circuits outputs complementary outputs for coincidence determination signals exhibiting coincidence to said select means.

5. The content addressable memory of claim 2, wherein an output of said select means is equipped with an encoder for converting to binary code.

6. A content addressable memory comprising:

a content addressable memory cell group being equipped with a plurality of memory cells addressed by a plurality of bit line pairs and a plurality of word lines arranged in a matrix, determining coincidence of data stored in said memory cells and data supplied at said bit line pairs, and outputting coincidence determination signals to a plurality of match lines provided so as to correspond to said plurality of word lines;

a plurality of hit flag cells, provided in such a manner as to correspond to respective words of said content addressable memory cell group, for storing corresponding word information inputted via said match line and outputting storage contents as hit flag signals; and select means for sequentially selecting hit flag cells outputting hit flag signals exhibiting coincidence, within said coincidence determination signals, from said plurality of hit flag cells and supplying a reset signal to already selected said hit flag cells.

7. A content addressable memory comprising:

a content addressable memory cell group being equipped with a plurality of memory cells addressed by a plurality of bit line pairs and a plurality of word lines arranged in a matrix, determining coincidence of data stored at a memory cell array corresponding to a word within said plurality of memory cells and data supplied at said bit line pairs, and outputting coincidence determination signals to a plurality of match lines provided so as to correspond to said plurality of word lines;

a plurality of storage circuits connected respectively to said plurality of match lines for storing said coincidence determination signals and resetting storage contents using an inputted reset signal; and a select circuit connected to said plurality of storage circuits for sequentially outputting a reset signal to storage circuits within said plurality of storage circuits having coinciding words and selecting smallest address values for data stored in said storage circuits as coinciding words.

8. The content addressable memory of claim 7, wherein each said storage circuit comprises:

a memory cell including a first inverter and a second inverter with inputs and outputs connected together;

a first transistor connected across said match line and said memory cell, for outputting a coincidence determination signal from a match line to said memory cell;

an output terminal connected to said memory cell and said select circuit, for outputting contents of said memory cell to said select circuit; and a second transistor connected across said memory cell and ground, for resetting contents of said memory cell using a reset signal from said select circuit.

9. The content addressable memory of claim 7, wherein each of said storage circuits comprises:

a memory cell including a first inverter and a second inverter with inputs and outputs connected together;

a first transistor connected across said match line and said memory cell, for outputting a coincidence determination signal from a match line to said memory cell; and a second transistor having a gate terminal connected to said memory cell, a source terminal connected to a charge up line and a drain terminal connected to ground via a switching transistor.

* * * * *